(12) United States Patent
Ryu et al.

(10) Patent No.: US 12,213,253 B2
(45) Date of Patent: Jan. 28, 2025

(54) PRINTED CIRCUIT BOARD

(71) Applicant: LG INNOTEK CO., LTD., Seoul (KR)

(72) Inventors: Sung Wuk Ryu, Seoul (KR); Seung Yul Shin, Seoul (KR); Joon Wook Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 293 days.

(21) Appl. No.: 17/771,397

(22) PCT Filed: Oct. 21, 2020

(86) PCT No.: PCT/KR2020/014429
§ 371 (c)(1),
(2) Date: Apr. 22, 2022

(87) PCT Pub. No.: WO2021/080325
PCT Pub. Date: Apr. 29, 2021

(65) Prior Publication Data
US 2022/0369458 A1    Nov. 17, 2022

(30) Foreign Application Priority Data
Oct. 22, 2019  (KR) ........................ 10-2019-0131253

(51) Int. Cl.
*H05K 1/11*       (2006.01)
*H05K 3/00*       (2006.01)
*H05K 3/40*       (2006.01)

(52) U.S. Cl.
CPC .............. *H05K 1/115* (2013.01); *H05K 1/111* (2013.01); *H05K 3/0032* (2013.01); *H05K 3/4069* (2013.01)

(58) Field of Classification Search
CPC ........ H05K 1/111; H05K 1/115; H05K 1/116; H05K 3/0032; H05K 3/4069; H05K 2201/09481
See application file for complete search history.

(56) References Cited

U.S. PATENT DOCUMENTS 8,323,771 B1 *  12/2012  Huemoeller ........... H05K 1/116
                                              428/209
9,984,898 B2 *   5/2018  Tsai ..................... H01L 23/3128
(Continued)

FOREIGN PATENT DOCUMENTS

CN         101453827         6/2009
CN         103329637         9/2013
(Continued)

OTHER PUBLICATIONS

International Search Report (with English Translation) and Written Opinion (with English Translation) dated Feb. 17, 2021 issued in PCT Application No. PCT/KR2020/014429.
(Continued)

*Primary Examiner* — Nathan Milakovich
(74) *Attorney, Agent, or Firm* — KED & ASSOCIATES, LLP

(57) ABSTRACT

A printed circuit board according to an embodiment includes an insulating layer; and a via portion disposed on the insulating layer; wherein the via portion includes: a first pad disposed under the insulating layer; a second pad disposed on the insulating layer; and a via part disposed between the first and second pads in the insulating layer; and wherein a width of the first pad is less than or equal to a width of a lower surface of the via part.

11 Claims, 9 Drawing Sheets

(56) References Cited

U.S. PATENT DOCUMENTS

| | | | |
|---|---|---|---|
| 10,021,785 B2 | 7/2018 | Kang et al. | |
| 10,334,728 B2 * | 6/2019 | Ho | H05K 3/10 |
| 2008/0225501 A1 | 9/2008 | Cho et al. | |
| 2009/0294164 A1 | 12/2009 | Kim et al. | |
| 2012/0066902 A1 | 3/2012 | Kim et al. | |
| 2012/0175153 A1 * | 7/2012 | Kaneko | H05K 3/4682 174/251 |
| 2014/0104798 A1 | 4/2014 | Park et al. | |
| 2015/0016082 A1 | 1/2015 | Lee | |
| 2016/0192491 A1 | 6/2016 | Kang et al. | |
| 2017/0231093 A1 | 8/2017 | Ho et al. | |
| 2022/0418106 A1 * | 12/2022 | Ryu | H05K 1/0298 |

FOREIGN PATENT DOCUMENTS

| | | | |
|---|---|---|---|
| CN | 104284514 | 1/2015 | |
| CN | 105744739 | 7/2016 | |
| CN | 107046016 | 8/2017 | |
| JP | 2005-108941 | 4/2005 | |
| KR | 10-2009-0123284 | 12/2009 | |
| KR | 10-0990588 | 10/2010 | |
| KR | 10-1044106 | 6/2011 | |
| KR | 10-2012-0137176 | 12/2012 | |
| KR | 10-1300413 | 8/2013 | |
| KR | 10-2014-0048563 | 4/2014 | |
| KR | 10-1516072 | 4/2015 | |
| KR | 10-2016-0079413 | 7/2016 | |
| WO | WO-2012108381 A1 * | 8/2012 | H05K 3/4069 |

OTHER PUBLICATIONS

Korean Office Action dated Apr. 16, 2024 issued in Application No. 10-2019-0131253.

Chinese Office Action dated Aug. 20, 2024 issued in Application No. 202080080555.5.

Korean Office Action dated Nov. 28, 2024 issued in Application No. 10-2019-0131253.

* cited by examiner

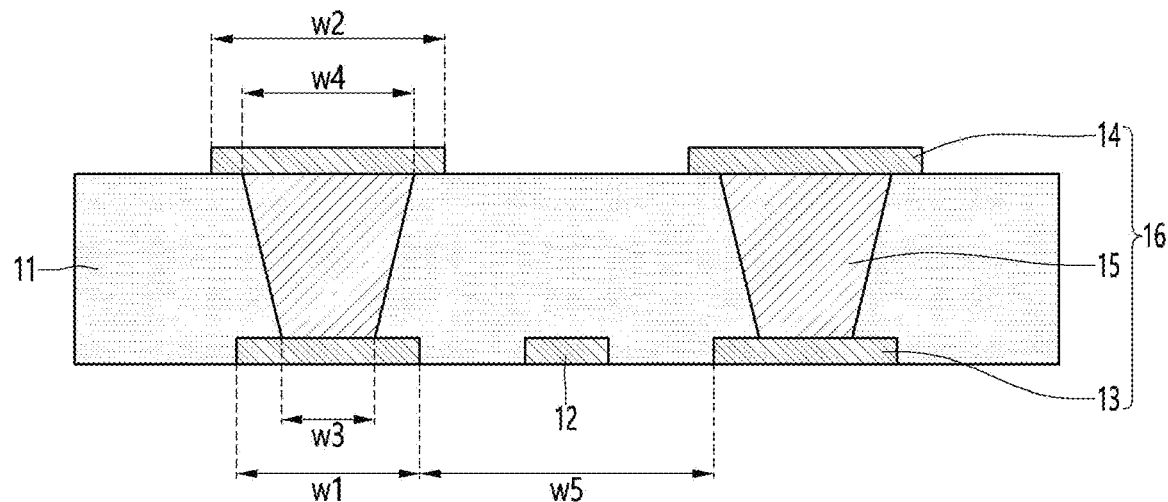
(a)   PRIOR ART
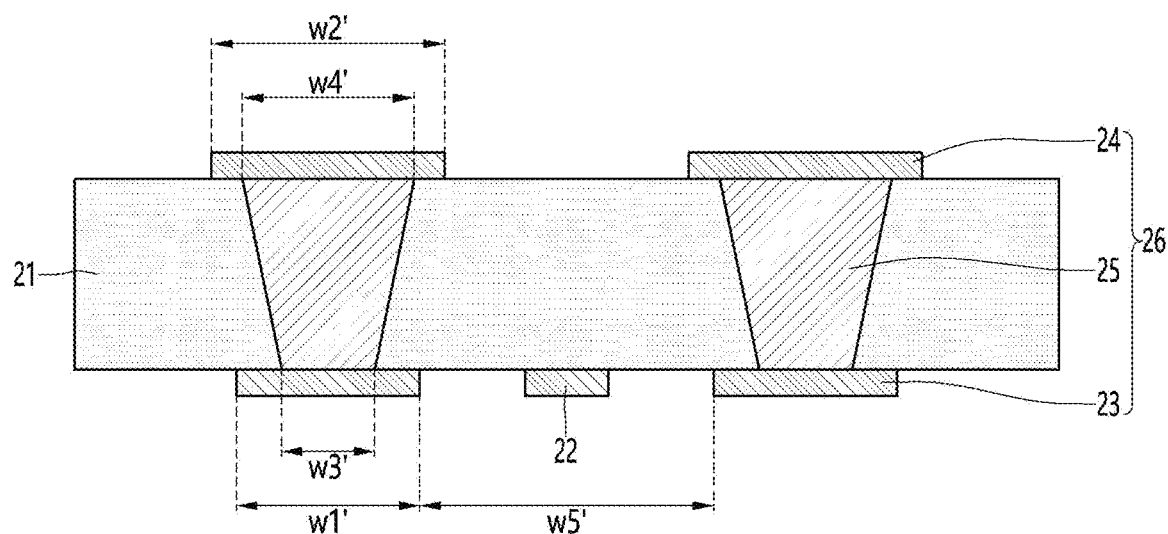
(b)   PRIOR ART

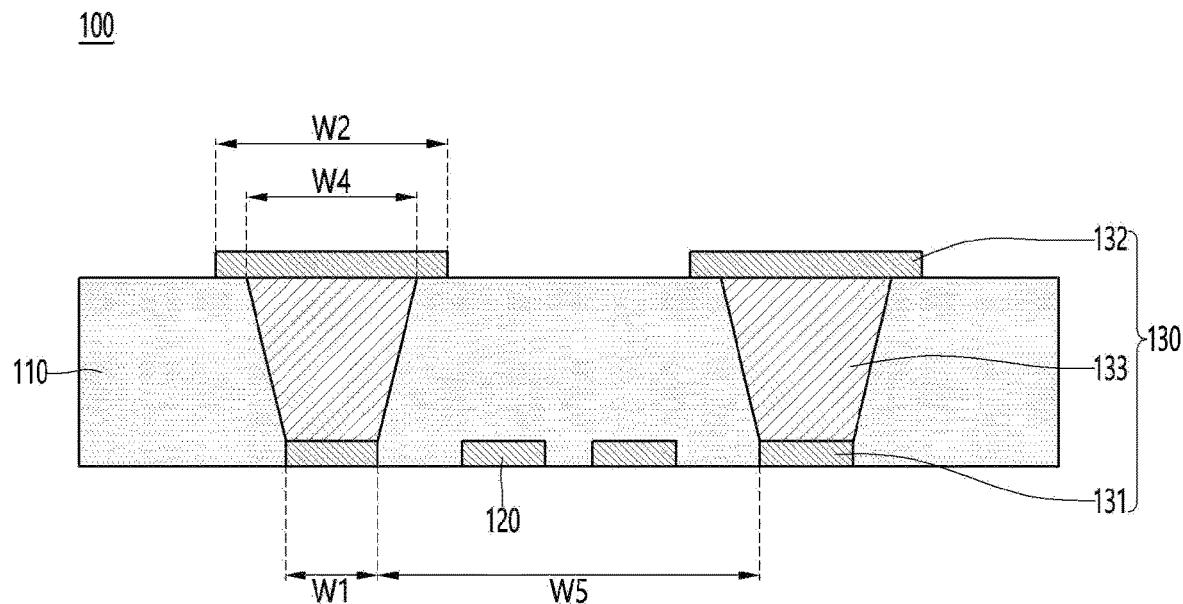
FIG. 3
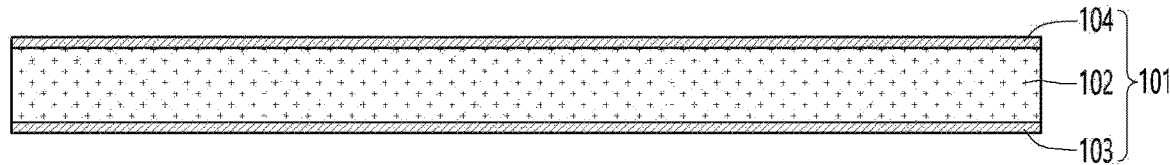
FIG. 4
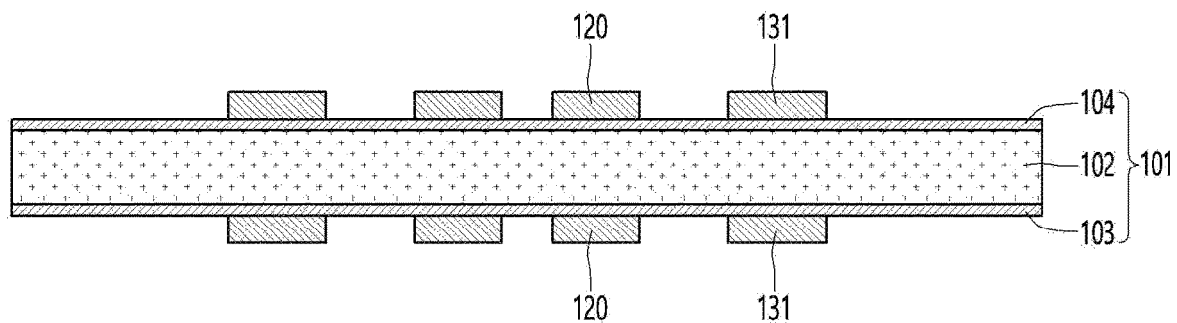

FIG. 9
(a)
PRIOR ART
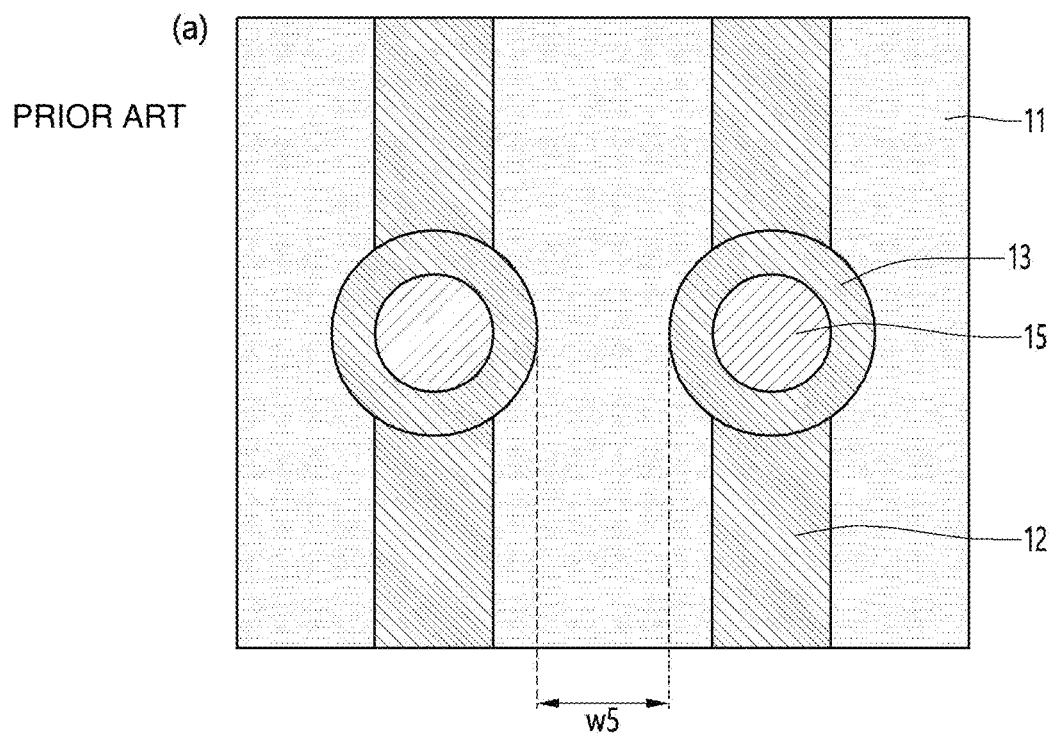
(b)
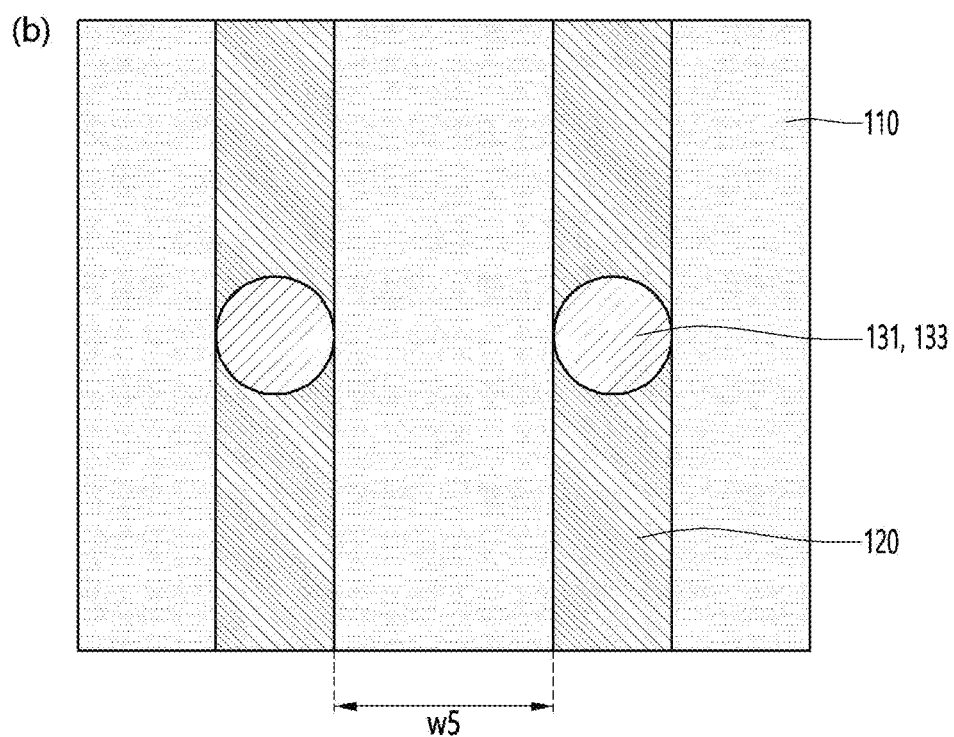

PRINTED CIRCUIT BOARD

CROSS-REFERENCE TO RELATED PATENT APPLICATIONS

This application is a U.S. National Stage Application under 35 U.S.C. § 371 of PCT Application No. PCT/KR2020/014429, filed Oct. 21, 2020, which claims priority to Korean Patent Application No. 10-2019-0131253, filed Oct. 22, 2019, whose entire disclosures are hereby incorporated by reference.

TECHNICAL FIELD

An embodiment relates to a printed circuit board and a method of manufacturing the same.

BACKGROUND ART

A line width of circuits is becoming smaller as the miniaturization, weight reduction, and integration of electronic components accelerate. In particular, as design rules of semiconductor chips are integrated on a nanometer scale, a circuit line width of a package substrate or a printed circuit board on which a semiconductor chip is mounted is reduced to several micrometers or less.

Various methods have been proposed in order to increase the degree of circuit integration of the printed circuit board, that is in order to miniaturize the line width of the circuits. A semi-additive process (SAP) method and a modified semi-additive process (MSAP) have been proposed in order to prevent loss of line width of the circuits in the etching step to form a pattern after copper plating.

Thereafter, an Embedded Trace Substrate (hereinafter referred to as 'ETS') method in which copper foil is buried in an insulating layer to implement a finer circuit pattern has been used in the art. The ETS method is manufactured by embedding the copper foil circuit in the insulating layer instead of forming it on the surface of the insulating layer. For this reason, there is no circuit loss due to etching, so it is advantageous to refine the circuit pitch.

Meanwhile, recently, efforts are being made to develop an improved 5th generation (5G) communication system or a pre-5G communication system in order to meet the demand for wireless data traffic. Here, the 5G communication system uses ultra-high frequency (mmWave) bands (sub 6 gigabytes (6 GHz), 28 gigabytes (28 GHz), 38 gigabytes (38 GHz) or higher frequencies) to achieve high data rates.

And, integration technologies such as beamforming, massive MIMO, and array antenna are being developed in order to alleviate the path loss of radio waves in the very high frequency band and increase the propagation distance of radio waves in the 5G communication system. Considering that these frequency bands can consist of hundreds of active antennas of wavelengths, the antenna system becomes relatively large.

Since these antennas and AP modules are patterned or mounted on a printed circuit board, low loss of the printed circuit board is very important. This means that several substrates constituting the active antenna system, ie, an antenna substrate, an antenna feeding substrate, a transceiver substrate, and a baseband substrate, must be integrated into one compact unit.

And, the printed circuit board applied to the 5G communication system as described above is manufactured according to the trend of light, thin and compact, and accordingly, the circuit pattern is gradually becoming finer.

However, the printed circuit board of the prior art has a significantly reduced design freedom due to the pad connected to the via, and this has a problem in that RF performance is also degraded in the 5G NR era.

Therefore, a new technology for miniaturization and thinning of semiconductor package technology is required in accordance with the 5G era.

DISCLOSURE

Technical Problem

An embodiment provides a printed circuit board and a method of manufacturing the same having a new structure.

In addition, an embodiment provides a printed circuit board including a via portion having the same width of a via and a first pad directly connected to the via, and a method of manufacturing the same.

In addition, the embodiment provides a printed circuit board including a via portion in which a width of a via is greater than a width of a first pad directly connected to the via, and a method of manufacturing the same.

The technical problem to be solved in the embodiment is not limited to the technical problem mentioned above, and another technical problem not mentioned will be clearly understood by those of ordinary skill in the art to which the present invention belongs from the following description.

Technical Solution

A printed circuit board according to an embodiment includes an insulating layer; and a via portion disposed on the insulating layer; wherein the via portion includes: a first pad disposed under the insulating layer; a second pad disposed on the insulating layer; and a via part disposed between the first and second pads in the insulating layer; and wherein a width of the first pad is less than or equal to a width of a lower surface of the via part.

In addition, an upper surface of the via part is greater than the width of the lower surface of the via part.

In addition, a width of an upper surface of the first pad is same as a width of a lower surface of the first pad.

In addition, the first pad is disposed in a lower region of the insulating layer, and the via part is disposed to cover a side surface and an upper surface of the first pad.

In addition, a lower surface of the via part is positioned on the same plane as each of a lower surface of the first pad and a lower surface of the insulating layer.

In addition, the first pad is disposed to protrude under a lower surface of the insulating layer, and the via part includes a first region in contact with an upper surface of the first pad and a second region not in contact with the upper surface of the first pad.

In addition, a central portion of the via part is aligned on the same vertical line as a central portion of the first pad.

In addition, the first pad is disposed in a lower region of the insulating layer, wherein a part of a side surface and a part of an upper surface of the first pad are covered by the insulating layer, and wherein a remaining part of the side surface and a remaining part of the upper surface of the first pad are covered by the via pad.

In addition, a central portion of the via part is displaced from a central portion of the first pad on the same vertical line.

In addition, the insulating layer is formed of a photocurable resin (PID: Photoimageable dielectics).

On the other hand, a manufacturing method of the printed circuit board according to the embodiment includes preparing a carrier; forming a first pad on the carrier; forming an insulating layer covering the first pad on the carrier; forming a via hole passing through the insulating layer and exposing at least a portion of an upper surface of the first pad; forming a via part in the via hole; forming a second pad on the insulating layer in contact with an upper surface of the via part; and removing the carrier; wherein a width of a lower portion of the via hole is greater than or equal to a width of the first pad, and wherein a width of a lower surface of the via part is greater than or equal to the width of the first pad.

In addition, a width of the upper surface of the via part is greater than the width of the lower surface of the via part, and a width of an upper surface of the first pad is same as a width of a lower surface of the first pad.

In addition, a width of the first pad is smaller than a width of a lower surface of the via part, and wherein a central portion of the via part is aligned on the same vertical line as a central portion of the first pad, and wherein the via part is disposed to cover a side surface and an upper surface of the first pad.

In addition, a lower surface of the via part is positioned on the same plane as a lower surface of the first pad and a lower surface of the insulating layer, respectively.

In addition, a central portion of the via part is displaced from the central portion of the first pad on the same vertical line, and wherein a part of a side surface and a part of an upper surface of the first pad are covered by the insulating layer, and wherein a remaining part of the side surface and the remaining part of the upper surface of the first pad are covered by the via pad.

In addition, a manufacturing method of the printed circuit board according to the embodiment includes preparing an insulating layer; forming a first pad on a lower surface of the insulating layer; forming a via hole exposing at least a portion of an upper surface of the first pad in the insulating layer; forming a via part in the via hole; and forming a second pad on an upper surface of the insulating layer in contact with an upper surface of the via part; wherein a width of an upper surface of via part is greater than a width of a lower surface of the via part, wherein each of the first and second pads includes an upper surface and a lower surface having the same width as each other, and wherein the width of the lower surface of the via part is greater than or equal to a width of the first pad.

In addition, the via part includes a first region in contact with the upper surface of the first pad and a second region in non-contact with the upper surface of the first pad.

Advantageous Effects

The via portion of the embodiment includes a via part passing through the insulating layer, a first pad disposed under the via part, and a second pad disposed on the via part. In this case, the width of the first pad in the printed circuit board of the embodiment is not greater than the width of the via part. In other words, the width of the first pad in the printed circuit board of the embodiment may be equal to or smaller than the width of the via part.

According to this, the printed circuit board of the embodiment can increase a separation distance between a plurality of via portions adjacent to each other, and accordingly, it is easy to implement a fine pattern of the circuit pattern, so that the circuit density can be increased.

In addition, the embodiment can improve the design freedom of the overall printed circuit board according to the design change of the via part, and accordingly, it is possible to secure a fine pattern implementation and substrate reliability.

DESCRIPTION OF DRAWINGS

FIG. 1 is a view showing a printed circuit board according to a comparative example.

FIG. 2 is a view showing a printed circuit board according to a first embodiment.

FIGS. 3 to 8 are views showing a manufacturing method of the printed circuit board according to the first embodiment shown in FIG. 2 in order of process.

FIG. 9 is a view comparing separation distances between a plurality of via portions in the printed circuit boards according to a comparative example and an embodiment.

MODES OF THE INVENTION

Figure 5:
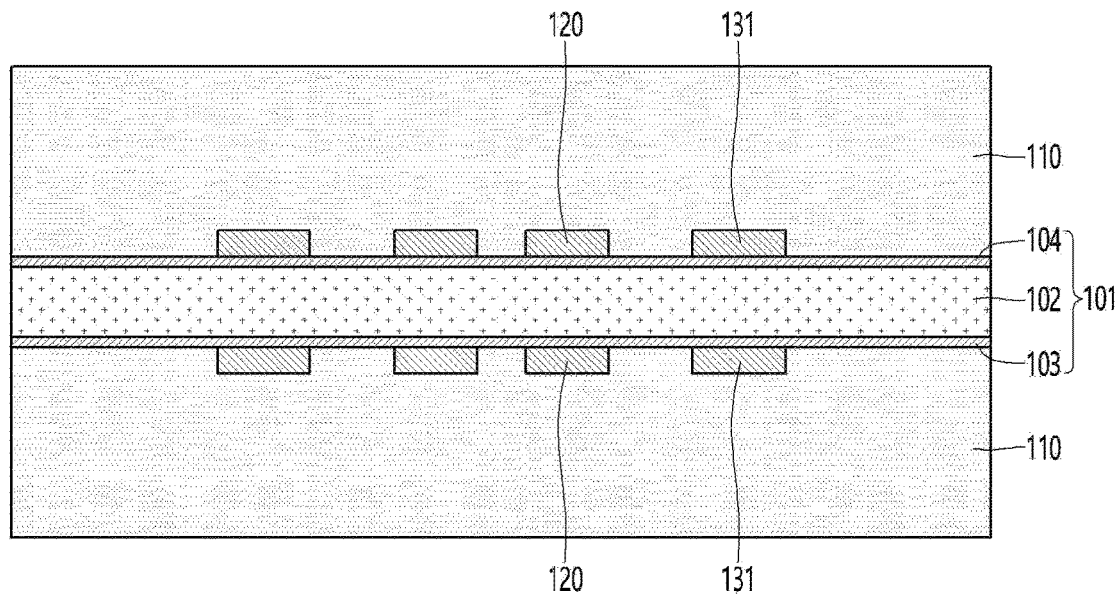

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The singular expression includes the plural expression unless the context clearly dictates otherwise.

It will be further understood that the terms "includes," or "have," when used herein, specify the presence of stated features, integers, steps, operations, elements, and/or components, but do not preclude the presence or addition of one or more other features, integers, steps, operations, elements, components, and/or groups thereof.

Hereinafter, an embodiment of the present invention will be described in detail with reference to the accompanying drawings.

FIG. 1 is a view showing a printed circuit board according to a comparative example. FIG. 1 (a) is a view showing a printed circuit board including a buried circuit pattern manufactured by an ETS method, and FIG. 1 (b) is a view showing a printed circuit board including a normal protruding circuit pattern.

Referring to FIG. 1 (a), a printed circuit board according to a comparative example includes a circuit pattern manufactured by an ETS method.

Specifically, the printed circuit board manufactured by the ETS method includes an insulating layer 11, a circuit pattern 12, and a via portion 16. At this time, although it is illustrated that the circuit pattern 12 is disposed only under the insulating layer 11 in the drawing, the circuit pattern is additionally disposed with a protruding structure on the upper surface of the insulating layer 11.

The circuit pattern 12 is embedded in the insulating layer 11.

Preferably, the circuit pattern 12 is buried in a lower region of the insulating layer 11. Accordingly, the lower surface of the circuit pattern 12 is disposed on the same plane as the lower surface of the insulating layer 11.

An upper circuit pattern (not shown) is additionally disposed on the upper surface of the insulating layer 11, and the upper circuit pattern has a structure protruding on the upper surface of the insulating layer 11.

A via portion 16 is disposed in the insulating layer 11.

At this time, the via portion 15 includes a via part 15 disposed in the insulating layer 11 and passing through the insulating layer 11, a first pad 13 buried in the lower region of the insulating layer 11, and a second pad 14 disposed on the upper surface of the insulating layer 11.

In this case, the first pad 13 has a first width w1, and the second pad 14 has a second width w2. The first width w1 may be the same as the second width w2, or alternatively, it may be smaller than the second width w2.

In addition, the lower surface of the via part 15 is in contact with the upper surface of the first pad 13 and has a third width w3. In addition, the upper surface of the via part 15 is in contact with the lower surface of the second pad 14 and has a fourth width w4. In this case, the third width w3 is smaller than the fourth width w4, and accordingly, the via part 15 has a shape in which the width gradually decreases from an upper portion to a lower portion.

Meanwhile, the third width w3 of the lower surface of the via part 15 is smaller than the first width w1 of the first pad 13. In addition, the fourth width w4 of the upper surface of the via part 15 is smaller than the second width w2 of the second pad 14. That is, the first pad 13 and the second pad 14 have a structure extending in a horizontal direction from upper and lower portions of the via part 15, respectively.

Meanwhile, in recent years, circuit patterns have been gradually refined. And, an outermost layer must be implemented by the ETS method in the case of a fine circuit pattern having a width/space of 15 μm/15 μm or less. That is, a stable fine pattern can be formed only when the circuit pattern is formed by the ETS method in the case of a fine circuit pattern in which the distance of each circuit pattern must be 15 μm or less apart while the circuit pattern of the outermost layer has a width of 15 μm.

However, the first width w1 of the first pad 13 in the printed circuit board in the comparative example as described above is greater than the third width w3 of the lower surface of the via part 15, and the second width w2 of the second pad 14 is greater than the fourth width w4 of the upper surface of the via part 15. Accordingly, the separation distance between the adjacent via parts is reduced. In other words, the separation distance w5 between the adjacent first pads 13 may be reduced in the printed circuit board in the comparative example.

In other words, the separation distance between the first pads 13 is smaller than the separation distance between the lower regions of the adjacent via parts in the printed circuit board in the comparative example.

Referring to FIG. 1 (b), a printed circuit board according to a comparative example includes a circuit pattern having a protruding structure.

Specifically, the printed circuit board includes an insulating layer 21, a circuit pattern 22, and a via portion 26. At this time, although it is illustrated that the circuit pattern 22 is disposed only under the insulating layer 21 in the drawing, the circuit pattern is additionally disposed on the upper surface of the insulating layer 21 having a protruding structure.

The circuit pattern 22 has a structure protruding under the lower surface of the insulating layer 21. Accordingly, the upper surface of the circuit pattern 22 is disposed on the same plane as the lower surface of the insulating layer 21.

A via portion 26 is disposed in the insulating layer 21.

In this case, the via portion 26 includes a via part 25 disposed in the insulating layer 21 and passing through the insulating layer 21, a first pad 23 protruding under the lower surface of the insulating layer 21, and a second pad 24 disposed on the upper surface of the insulating layer 21.

In this case, the first pad 24 has a first width w1', and the second pad 25 has a second width w2'. The first width w1' may be the same as the second width w2', or alternatively, it may be smaller than the second width w2'

In addition, the lower surface of the via part 25 contacts the upper surface of the first pad 23 and has a third width w3'. In addition, the upper surface of the via part 25 is in contact with the lower surface of the second pad 24 and has a fourth width w4'. In this case, the third width w3' is smaller than the fourth width w4', and accordingly, the via part 25 has a shape in which the width gradually decreases from the upper portion to the lower portion.

Meanwhile, the third width w3' of the lower surface of the via part 25 is smaller than the first width w1' of the first pad 23. In addition, the fourth width w4' of the upper surface of the via part 25 is smaller than a second width w2' of the second pad 24. That is, the first pad 23 and the second pad 24 have a structure extending in the horizontal direction respectively on and under the via part 25.

However, the first width w1' of the first pad 23 in the printed circuit board in the comparative example as described above is greater than the third width w3' of the lower surface of the via part 25, and the second width w2' of the second pad 24 is greater than the fourth width w4' of the upper surface of the via part 25. Accordingly, the separation distance between the adjacent via parts is reduced. In other words, the separation distance w5' between the adjacent first pads 23 may be reduced in the printed circuit board in the comparative example.

In addition, as 5G technology develops in recent years, interest in printed circuit boards that can reflect this is increasing. At this time, the printed circuit board must have a high multi-layer structure in order to apply the 5G technology, and accordingly, the circuit pattern should be miniaturized. However, although the comparative example is possible to form a fine pattern due to the structure of the via part as described above, there is a problem in that the circuit density in the space between the via portions is lowered.

FIG. 2 is a view showing a printed circuit board according to a first embodiment.

Referring to FIG. 2, a printed circuit board 100 includes an insulating layer 110, a circuit pattern 120, and a via portion 130.

The printed circuit board 100 can represent an electrical wiring connecting circuit components based on a circuit design as a wiring diagram, and a electrical conductor can be reproduced on an insulator. In addition, the printed circuit board 100 may mount electrical components and form wirings for connecting them in a circuit, and may mechanically fix components other than the electrical connection function of the components.

The insulating layer 110 may be a support substrate of the printed circuit board 100 on which a single circuit pattern is formed, but it may refer to an insulating region in which any one circuit pattern of the printed circuit board 100 having a plurality of stacked structures is formed.

Preferably, the insulating layer 110 may represent an insulating region of any one of the printed circuit boards 100 having a plurality of stacked structures.

The insulating layer 110 may include a photocurable resin or a photosensitive resin. That is, the insulating layer 110 may be formed of a PID (Photoimageable Dielectrics) material.

To this end, the insulating layer 110 may include an epoxy resin, a photo initiator, a silicon-based filler (Si filler), a curing agent, and the like. For example, the insulating layer 110 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

In an embodiment, a small-sized circuit pattern to be cleaned and a fine via portion may be formed using exposure and development, and the like by forming the insulating layer 110 with a photocurable resin.

A circuit pattern 120 may be disposed in a lower region of the insulating layer 110. The circuit pattern 120 may have a structure buried in the lower region of the insulating layer 110. The circuit pattern 120 according to the first embodiment may be manufactured by an Embedded Trace Substrate (ETS) method.

The circuit pattern 120 is a wire that transmits an electrical signal, and may be formed of a metal material having high electrical conductivity. To this end, the circuit pattern 120 may be formed of at least one metal material selected from among gold (Au), silver (Ag), platinum (Pt), titanium (Ti), tin (Sn), copper (Cu), and zinc (Zn). In addition, the circuit pattern 120 may be formed of a paste or solder paste containing one metal material of gold (Au), silver (Ag), platinum (Pt), titanium (Ti), tin (Sn), copper (Cu), and zinc (Zn) having excellent bonding strength. Preferably, the circuit pattern 120 may be formed of copper (Cu) having high electrical conductivity and a relatively inexpensive price.

In addition, the printed circuit board 100 may include a via portion 130.

The via portion 130 includes a first pad 131 disposed under the insulating layer 110, a second pad 132 disposed on the insulating layer 110, and a via part 133 passing through the insulating layer 110.

The first pad 131 may have a structure buried in the lower region of the insulating layer 110. The first pad 131 may be formed together with the circuit pattern 120, and accordingly, a part of the circuit pattern 120 may be the first pad 131.

The second pad 132 may be disposed on the upper surface of the insulating layer 110. The second pad 132 may have a structure that protrudes above the upper surface of the insulating layer 110.

The first pad 131 may be disposed in a lower region of the insulating layer 110 to have a first width W1. The first pad 131 may also be referred to as a land pad. The width of the lower surface of the first pad 131 may be the same as that of the upper surface of the first pad 131.

In addition, the second pad 132 may be disposed on the upper surface of the insulating layer 110 to have a second width W2. The second pad 132 may also be referred to as a capture pad. The width of the lower surface and the width of the upper surface of the second pad 132 may be the same as each other.

In addition, the via part 133 of the via portion 130 may be disposed in the insulating layer 110. A lower surface of the via part 133 may directly contact an upper surface of the first pad 131. Also, an upper surface of the via part 133 may directly contact a lower surface of the second pad 132.

The width of the lower surface of the via part 133 may be the same as the first width W1 of the first pad 131. That is, the lower surface of the via part 133 may have the first width W1.

Also, the width of the upper surface of the via part 133 may be smaller than the second width W2 of the second pad 132. That is, the upper surface of the via part 133 may have a fourth width W4 smaller than the second width W2 of the second pad 132.

In addition, the first width W1 of the lower surface of the via part 133 is smaller than the fourth width W4 of the upper surface of the via part 133. That is, the via part 133 may have a shape in which the width gradually decreases from the upper surface to the lower surface. In this case, a planar shape of the lower surface and the upper surface of the via part 133 may be a circular shape. Accordingly, the overall shape of the via part 133 may be a cylindrical shape, but is not limited thereto. Also, when the via part 133 has a cylindrical shape, the first width W1 of the lower surface of the via part 133 may be a diameter of the lower surface of the via part 133. Also, the fourth width W1 of the upper surface of the via part 133 may be a diameter of the upper surface of the via part 133.

As described above, the width of the lower surface of the via part 133 in the embodiment is the same as the width of the first pad 131 disposed under the via part 133. Accordingly, a separation distance W5 between the plurality of via parts in the embodiment may increase compared to the comparative example illustrated in FIG. 1. That is, a separation distance between the lower surfaces of the plurality of via parts in an embodiment may be the same as a separation distance between the plurality of first pads. Accordingly, the separation distance between the plurality of via parts in the embodiment may be increased, thereby improving circuit density and design freedom.

At this time, the insulating layer 11 in the comparative example was formed of a thermosetting resin. Accordingly, a via hole for forming the via part may be formed by a laser process. In this case, when the width of the first pad 131 and the width of the lower surface of the via part 133 are the same as in the embodiment, even if a formation position of the via hole is slightly shifted, the via hole may penetrate to another insulating layer below, and thus a defect may occur. That is, the first pad in the comparative example functions as a stopper for performing the laser process, and thus there is a limit in reducing the width of the first pad.

In contrast, the insulating layer 110 in the embodiment is formed of a photocurable resin as described above. Accordingly, the via hole for forming the via part 133 in the embodiment is formed through exposure and development processes, and accordingly, the via hole may be formed only in the desired insulating layer regardless of the width of the first pad 131. Accordingly, the width of the first pad 131 in the embodiment may be reduced as described above, and thus the separation distance between the plurality of via portions 130 may be increased.

The via part 133 as described above may be formed by filling the inside of the via hole formed as described above with a metal material or plating with a metal material.

The metal material for forming the via part 133 may be any one material selected from Cu, Ag, Sn, Au, Ni, and Pd, and the metal material may be filled by any one or a combination method of electroless plating, electrolytic plating, screen printing, sputtering, evaporation, ink-jetting, and dispensing.

The via portion of the embodiment includes a via part passing through the insulating layer, a first pad disposed under the via part, and a second pad disposed on the via part. In this case, the width of the first pad in the printed circuit board of the embodiment is not greater than the width of the via part. In other words, the width of the first pad of the printed circuit board in the embodiment may be the same as the width of the via part.

According to this, the printed circuit board of the embodiment can increase a separation distance between a plurality of via portions adjacent to each other, and accordingly, it is easy to implement a fine pattern of the circuit pattern, so that the circuit density can be increased.

In addition, the embodiment can improve the design freedom of the overall printed circuit board according to the design change of the via part, and accordingly, it is possible to secure a fine pattern implementation and substrate reliability.

FIGS. 3 to 8 are views showing a manufacturing method of the printed circuit board according to the first embodiment shown in FIG. 2 in order of process.

In the method of manufacturing the printed circuit board 100 according to the first embodiment, a manufacturing process of a plurality of printed circuit boards is performed on both sides of a carrier 101 based on the carrier 101.

Referring to FIG. 3, the carrier 101 for manufacturing the printed circuit board 100 is prepared. The carrier 101 includes a dummy insulating layer 102 and copper foil layers 103 and 104 disposed on both surfaces of the dummy insulating layer 102. Accordingly, the printed circuit board 100 uses the carrier 101 to simultaneously manufacture a plurality of printed circuit boards. However, this is only an embodiment, and the manufacturing process of the printed circuit board may be performed only on an upper portion or a lower portion with respect to the carrier 101.

The copper foil layers 103 and 104 may be formed by electroless plating a metal material including copper on the dummy insulating layer 102.

Also, unlike the copper foil layers 103 and 104 formed by electroless plating on the surface of the dummy insulating layer 102, a general CCL (Copper Clad Laminate) may be used. At this time, when the copper foil layers 102 and 103 are formed by electroless plating, the electroless plating process may be performed in the order of degreasing process, soft corrosion process, pre-catalyst treatment process, activation process, electroless plating process, and oxidation treatment process.

In addition, the copper foil layers 103 and 104 may be formed by sputtering metal particles on the surface of the dummy insulating layer 102 using plasma instead of plating.

Next, referring to FIG. 4, a circuit pattern 120 is formed on the copper foil layers 103 and 104. The circuit pattern 120 may be formed through an ETS method using the carrier 101. However, this is only an example, and the circuit pattern 120 may be formed using an additive process, a subtractive process, a modified semi-additive process (MSAP), and SAP (Semi Additive Process) method, etc, which are typical printed circuit board manufacturing processes, and a detailed description thereof will be omitted here.

Meanwhile, a portion of the circuit pattern 120 formed on the copper foil layers 103 and 104 may function as the first pad 131 constituting the via portion 130.

Next, referring to FIG. 5, an insulating layer 110 is formed by covering the circuit pattern 120 on the copper foil layers 103 and 104.

The insulating layer 110 may include a photocurable resin or a photosensitive resin. To this end, the insulating layer 110 may include an epoxy resin, a photo initiator, a silicon-based filler (Si filler), a curing agent, and the like. For example, the insulating layer 110 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

Figure 6:
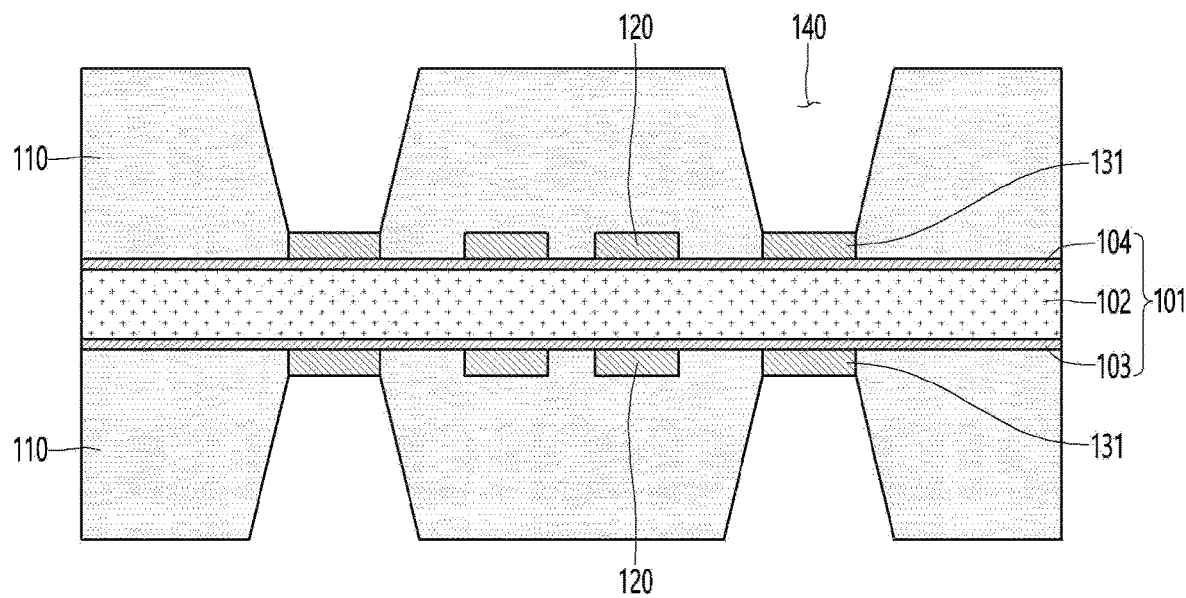

Next, referring to FIG. 6, a via hole 140 is formed in the insulating layer 110. In this case, the via hole 140 may be formed by performing an exposure and development process. Accordingly, the first pad 131 in the embodiment is not affected by the size of the via hole 140. That is, the via hole in the comparative example was formed by a laser process. Accordingly, the first pad functions as a stopper for determining the depth of the via hole in the laser process. Accordingly, the width of the first pad is affected by the size of the via hole, and preferably, the width of the first pad is formed to be larger than the width of the via hole.

Alternatively, the depth of the via hole 140 in the embodiment may be easily adjusted without a stopper layer such as the first pad 131 by forming the insulating layer 110 with a photocurable resin as described above, and thus forming the via hole 140 through exposure and development processes, etc.

Accordingly, the width of the lower portion of the via hole 140 may be the same as the width of the upper surface of the first pad 131.

Figure 7:
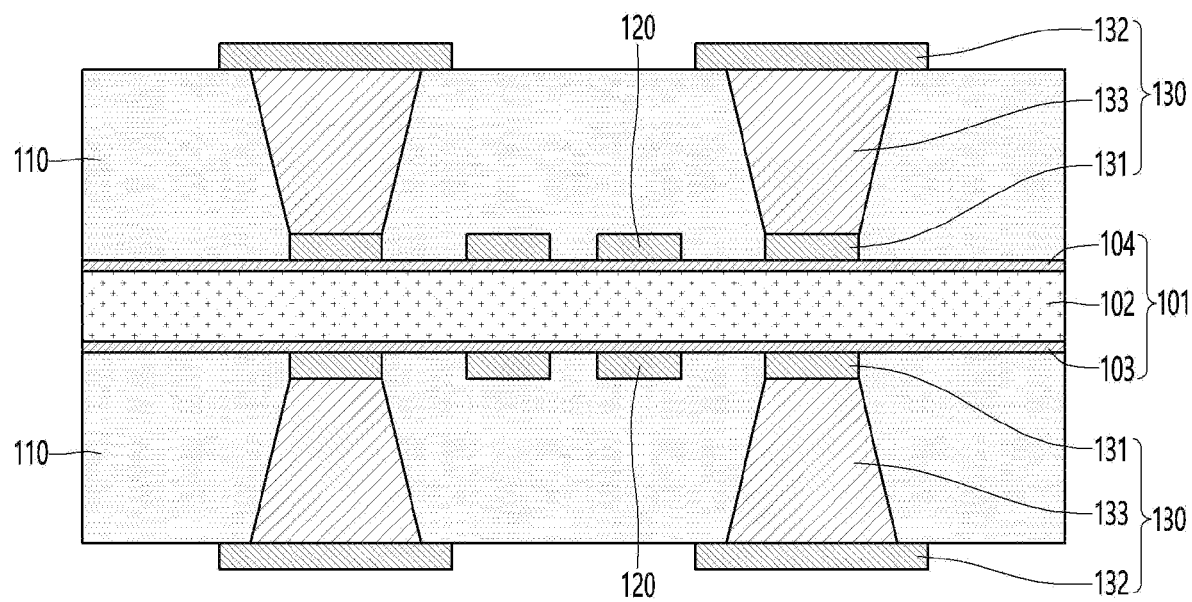

Next, referring to FIG. 7, the via part 133 may be formed by filling the inside of the via hole 140 formed in the insulating layer 110 with a metal material.

Preferably, the via part 133 may be formed by filling the via hole 140 with a metal material or plating the via hole 140 with a metal material.

The metal material for forming the via part 133 may be any one material selected from Cu, Ag, Sn, Au, Ni, and Pd, and the metal material may be filled by any one or a combination method of electroless plating, electrolytic plating, screen printing, sputtering, evaporation, ink-jetting, and dispensing.

In addition, a second pad 132 in contact with the upper surface of the via part 133 is formed on the insulating layer 110. In this case, an additional circuit pattern (not shown) disposed on the upper surface of the insulating layer 110 together with the second pad 132 may be formed in an embodiment.

Figure 8:
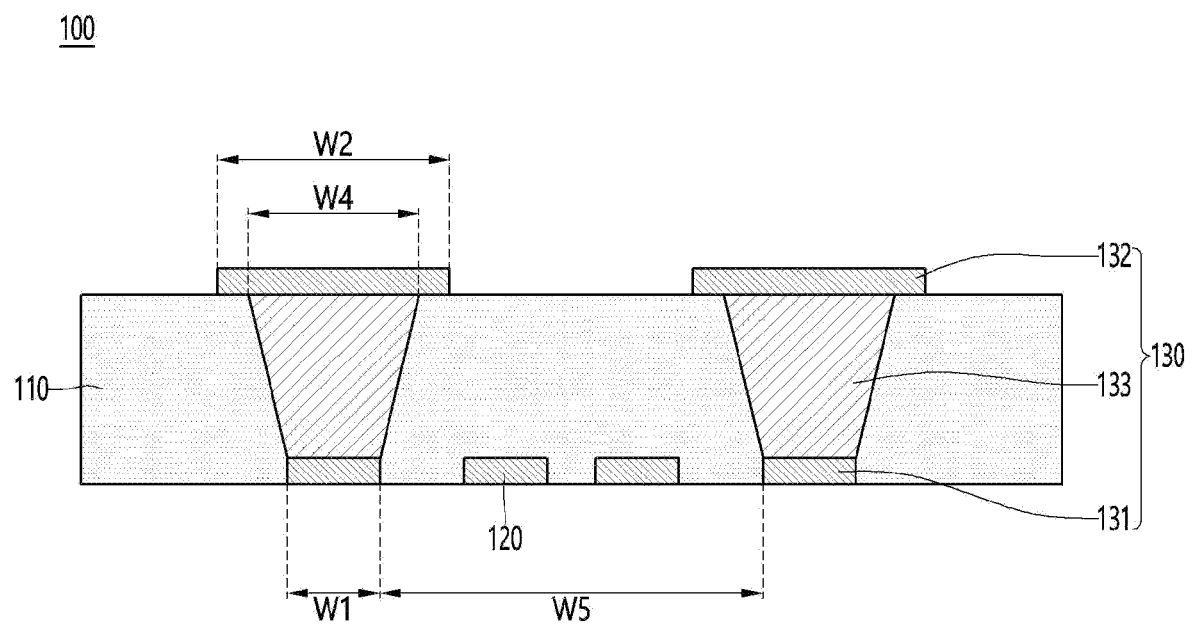

Next, referring to FIG. 8, the plurality of printed circuit boards 100 manufactured on both sides of the carrier 101 are separated from each other by removing the carrier 101.

In this case, the separation of the carrier 101 may be achieved by flash etching the copper foil layers 103 and 104 disposed on both surfaces of the dummy insulating layer 102.

The first pad 131 may be disposed in a lower region of the insulating layer 110 to have a first width W1. The first pad 131 may also be referred to as a land pad. The width of the lower surface of the first pad 131 may be the same as that of the upper surface.

In addition, the second pad 132 may be disposed on the upper surface of the insulating layer 110 to have a second width W2. The second pad 132 may also be referred to as a capture pad. The width of the lower surface and the width of the upper surface of the second pad 132 may be the same as each other.

In addition, the via part 133 of the via portion 130 may be disposed in the insulating layer 110. A lower surface of the via part 133 may directly contact an upper surface of the first pad 131. Also, an upper surface of the via part 133 may directly contact a lower surface of the second pad 132.

The width of the lower surface of the via part 133 may be the same as the first width W1 of the first pad 131. That is, the lower surface of the via part 133 may have the first width W1.

Also, the width of the upper surface of the via part 133 may be smaller than the second width W2 of the second pad 132. That is, the upper surface of the via part 133 may have a fourth width W4 smaller than the second width W2 of the second pad 132.

In addition, the first width W1 of the lower surface of the via part 133 is smaller than the fourth width W4 of the upper surface of the via part 133. That is, the via part 133 may have a shape in which the width gradually decreases from the upper surface to the lower surface. In this case, a planar shape of the lower surface and the upper surface of the via part 133 may be a circular shape. Accordingly, the overall shape of the via part 133 may be a cylindrical shape, but is not limited thereto. Also, when the via part 133 has a cylindrical shape, the first width W1 of the lower surface of the via part 133 may be a diameter of the lower surface of the via part 133. Also, the fourth width W1 of the upper surface of the via part 133 may be a diameter of the upper surface of the via part 133.

As described above, the width of the lower surface of the via part 133 in the embodiment is the same as the width of the first pad 131 disposed under the via part 133. Accordingly, a separation distance W5 between the plurality of via parts in the embodiment may increase compared to the comparative example illustrated in FIG. 1. That is, a separation distance between the lower surfaces of the plurality of via parts in an embodiment may be the same as a separation distance between the plurality of first pads. Accordingly, the separation distance between the plurality of via parts in the embodiment may be increased, thereby improving circuit density and design freedom.

At this time, the insulating layer 11 in the comparative example was formed of a thermosetting resin. Accordingly, a via hole for forming the via part may be formed by a laser process. In this case, when the width of the first pad 131 and the width of the lower surface of the via part 133 are the same as in the embodiment, even if a formation position of the via hole is slightly shifted, the via hole may penetrate to another insulating layer below, and thus a defect may occur. That is, the first pad in the comparative example functions as a stopper for performing the laser process, and thus there is a limit in reducing the width of the first pad.

In contrast, the insulating layer 110 in the embodiment is formed of a photocurable resin as described above. Accordingly, the via hole for forming the via part 133 in the embodiment is formed through exposure and development processes, and accordingly, the via hole may be formed only in the desired insulating layer regardless of the width of the first pad 131. Accordingly, the width of the first pad 131 in the embodiment may be reduced as described above, and thus the separation distance between the plurality of via portions 130 may be increased.

FIG. 9 is a view comparing separation distances between a plurality of via portions in the printed circuit boards according to a comparative example and an embodiment.

As shown in (a) of FIG. 9, the first width w1 of the first pad 13 in the printed circuit board of the comparative example is greater than the third width w3 of the lower surface of the via part 15, The second width w2 of the second pad 14 is greater than the fourth width w4 of the upper surface of the via part 15. Accordingly, the separation distance between the adjacent via parts is reduced. In other words, the separation distance w5 between the adjacent first pads 13 may be reduced in the printed circuit board in the comparative example.

In other words, the separation distance between the first pads 13 in the printed circuit board in the comparative example is smaller than the separation distance between the lower regions of the adjacent via parts.

In contrast, as shown in (b) of FIG. 9, the width of the lower surface of the via part 133 in the embodiment is the same as the width of the first pad 131 disposed under the via part 133. Accordingly, the separation distance W5 between the plurality of via parts in the embodiment may increase compared to the comparative example illustrated in FIG. 1. That is, in the embodiment, the separation distance between the lower surfaces of the plurality of via parts and the separation distance between the plurality of first pads may be the same. Accordingly, the separation distance between the plurality of via parts in the embodiment may be increased, thereby improving circuit density and design freedom.

Figure 10:
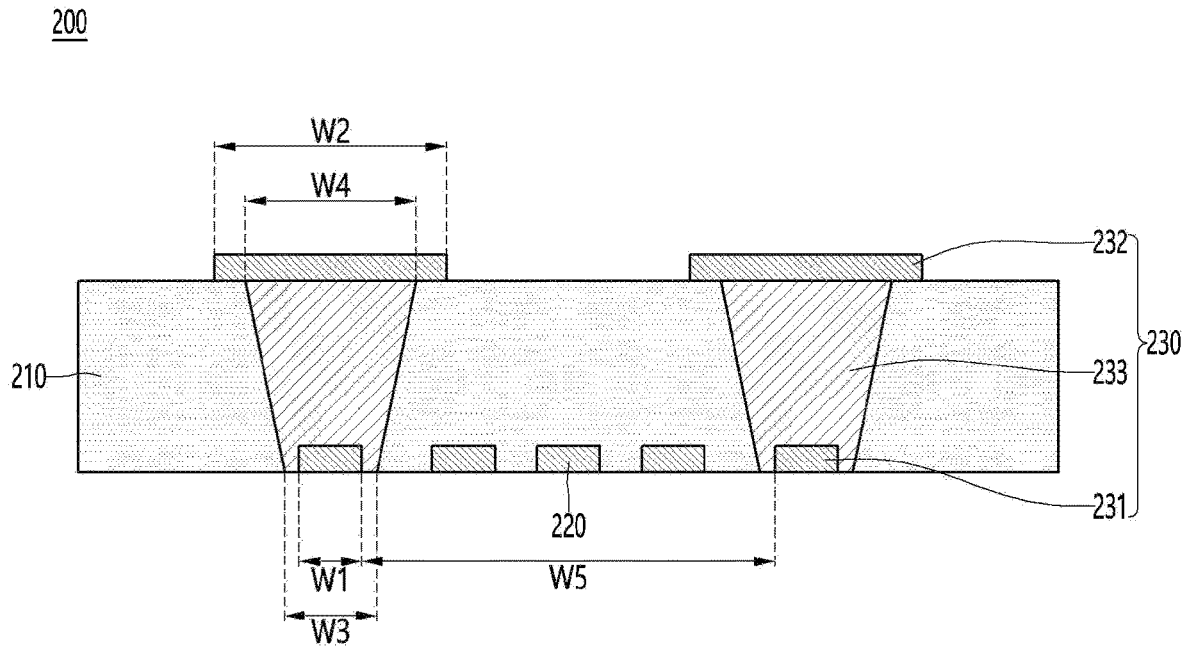
FIG. 10 is a view showing a printed circuit board according to a second embodiment.

FIG. 10 is a view showing a printed circuit board according to a second embodiment.

Referring to FIG. 10, the printed circuit board 200 includes an insulating layer 210, a circuit pattern 220, and a via portion 230.

The insulating layer 210 may include a photocurable resin or a photosensitive resin. To this end, the insulating layer 210 may include an epoxy resin, a photo initiator, a silicon-based filler (Si filler), a curing agent, and the like. For example, the insulating layer 210 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

A circuit pattern 220 may be disposed in a lower region of the insulating layer 210. The circuit pattern 220 may have a structure buried in the lower region of the insulating layer 210. The circuit pattern 220 having the protruding structure may be formed using an additive process, a subtractive process, a modified semi-additive process (MSAP), and SAP (Semi Additive Process) method, etc., which are typical printed circuit board manufacturing processes, and a detailed description thereof will be omitted here.

The circuit pattern 220 may be formed of at least one metal material selected from among gold (Au), silver (Ag), platinum (Pt), titanium (Ti), tin (Sn), copper (Cu), and zinc (Zn). In addition, the circuit pattern 220 may be formed of a paste or solder paste containing one metal material of gold (Au), silver (Ag), platinum (Pt), titanium (Ti), tin (Sn), copper (Cu), and zinc (Zn) having excellent bonding strength. Preferably, the circuit pattern 120 may be formed of copper (Cu) having high electrical conductivity and a relatively inexpensive price.

In addition, the printed circuit board 200 may include a via portion 230.

The via portion 230 includes a first pad 231 disposed under the insulating layer 120, a second pad 232 disposed on the insulating layer 210, and a via part 233 passing through the insulating layer 210.

The first pad 231 may have a structure buried in the lower region of the insulating layer 210. The first pad 231 may be formed together with the circuit pattern 220, and accordingly, a part of the circuit pattern 220 may be the first pad 231.

The second pad 232 may be disposed on the upper surface of the insulating layer 210. The second pad 232 may have a structure that protrudes above the upper surface of the insulating layer 210.

The first pad 231 may be disposed in a lower region of the insulating layer 210 to have a first width W1. The first pad 231 may also be referred to as a land pad. The width of the lower surface of the first pad 231 may be the same as that of the upper surface of the first pad 231.

In addition, the second pad 232 may be disposed on the upper surface of the insulating layer 210 to have a second width W2. The second pad 232 may also be referred to as a capture pad. The width of the lower surface and the width of the upper surface of the second pad 232 may be the same as each other.

In addition, the via part 233 of the via portion 230 may be disposed in the insulating layer 210. A lower surface of the via part 233 may directly contact an upper surface of the first pad 231. Also, an upper surface of the via part 233 may directly contact a lower surface of the second pad 232.

In this case, the via part 233 according to the second embodiment may be disposed to cover the first pad 231. That is, the width of the lower surface of the via part 233 is greater than the width of the upper surface of the first pad 231. Accordingly, the via part 233 may be disposed in the insulating layer 210 while surrounding the first pad 231.

That is, the third width W3 of the lower surface of the via part 233 may be greater than the first width W1 of the first pad 231. That is, the lower surface of the via part 233 may have a third width W3 greater than the first width W1.

Also, the width of the upper surface of the via part 233 may be smaller than the second width W2 of the second pad 232. That is, the upper surface of the via part 233 may have a fourth width W4 smaller than the second width W2 of the second pad 232.

In addition, the first width W1 of the lower surface of the via part 233 is smaller than the fourth width W4 of the upper surface of the via part 233. That is, the via part 233 may have a shape in which the width gradually decreases from the upper surface to the lower surface. In this case, a planar shape of the lower surface and the upper surface of the via part 233 may be a circular shape. Accordingly, the overall shape of the via part 233 may be a cylindrical shape, but is not limited thereto. In addition, when the via part 233 has a cylindrical shape, the third width W3 of the lower surface of the via part 233 may be a diameter of the lower surface of the via part 233. Also, the fourth width W4 of the upper surface of the via part 233 may be a diameter of the upper surface of the via part 233.

As described above, the width W3 of the lower surface of the via part 233 in the embodiment is greater than the width W1 of the first pad 231 disposed under the via part 233. Accordingly, the via part 233 may not be disposed on the first pad 231, but a lower surface thereof may be positioned on the same plane as the lower surface of the first pad 231. That is, a lower surface of the via part 233 may be positioned on the same plane as a lower surface of the first pad 231. Also, a lower surface of the via part 233 may be positioned on the same plane as a lower surface of the insulating layer 210. In addition, a lower surface of the via part 233 constituting the via portion 230 may be positioned lower than an upper surface of the first pad W1. Accordingly, the via part 233 in the embodiment may be disposed to cover the side surface and the upper surface of the first pad 231.

Accordingly, the separation distance W5 between the plurality of via parts in the embodiment may increase compared to the comparative example illustrated in FIG. 1. That is, a separation distance between the lower surfaces of the plurality of via parts in an embodiment may be the same as a separation distance between the plurality of first pads. Accordingly, the separation distance between the plurality of via parts in the embodiment may be increased, thereby improving circuit density and design freedom.

The via portion of the embodiment includes a via part passing through the insulating layer, a first pad disposed under the via part, and a second pad disposed on the via part. In this case, the width of the first pad in the printed circuit board of the embodiment is not greater than the width of the via part. In other words, the width of the first pad in the printed circuit board of the embodiment may be smaller than the width of the via part.

According to this, the printed circuit board of the embodiment can increase a separation distance between a plurality of via portions adjacent to each other, and accordingly, it is easy to implement a fine pattern of the circuit pattern, so that the circuit density can be increased.

In addition, the embodiment can improve the design freedom of the overall printed circuit board according to the design change of the via part, and accordingly, it is possible to secure a fine pattern implementation and substrate reliability.

Figure 11:
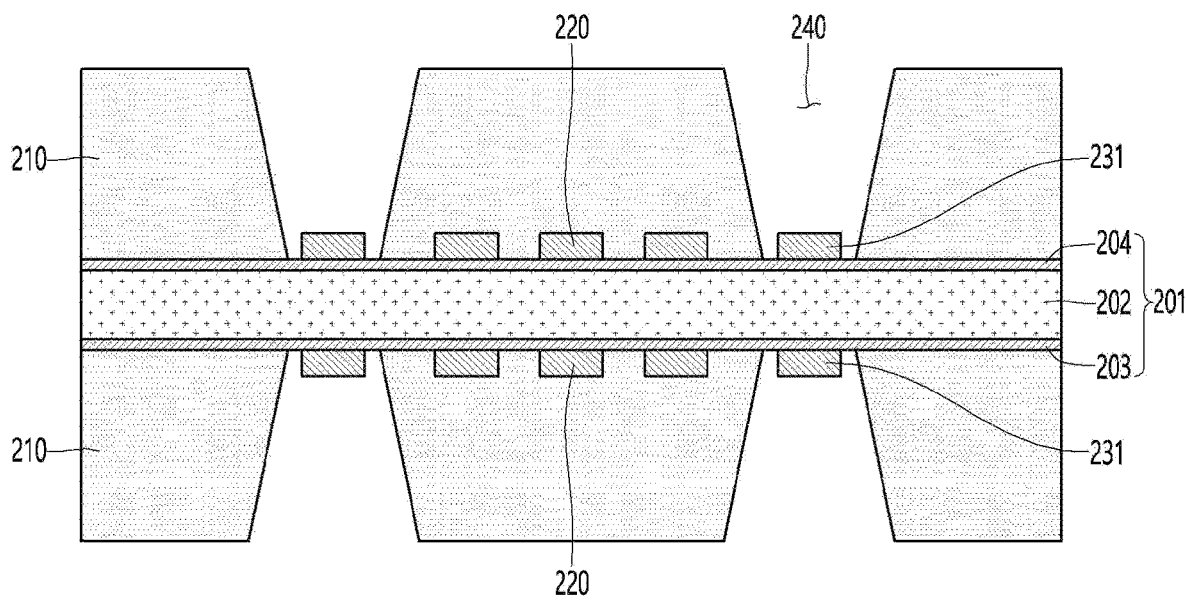
FIGS. 11 to 13 are views showing a method of manufacturing the printed circuit board according to the second embodiment shown in FIG. 10 in order of process.
Figure 12:
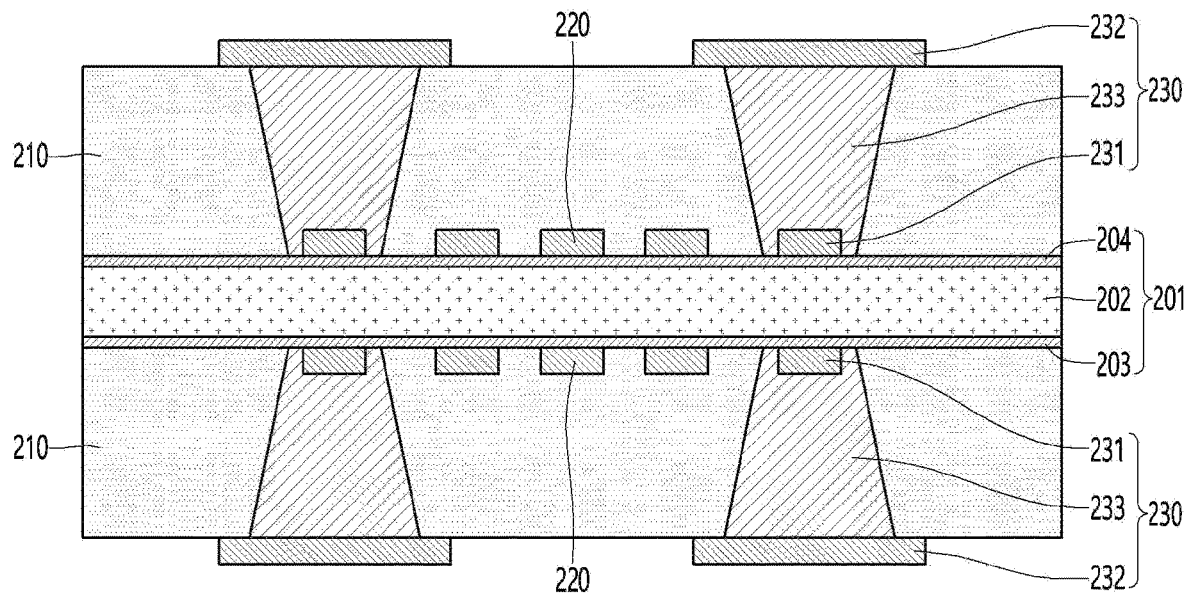
Figure 13:
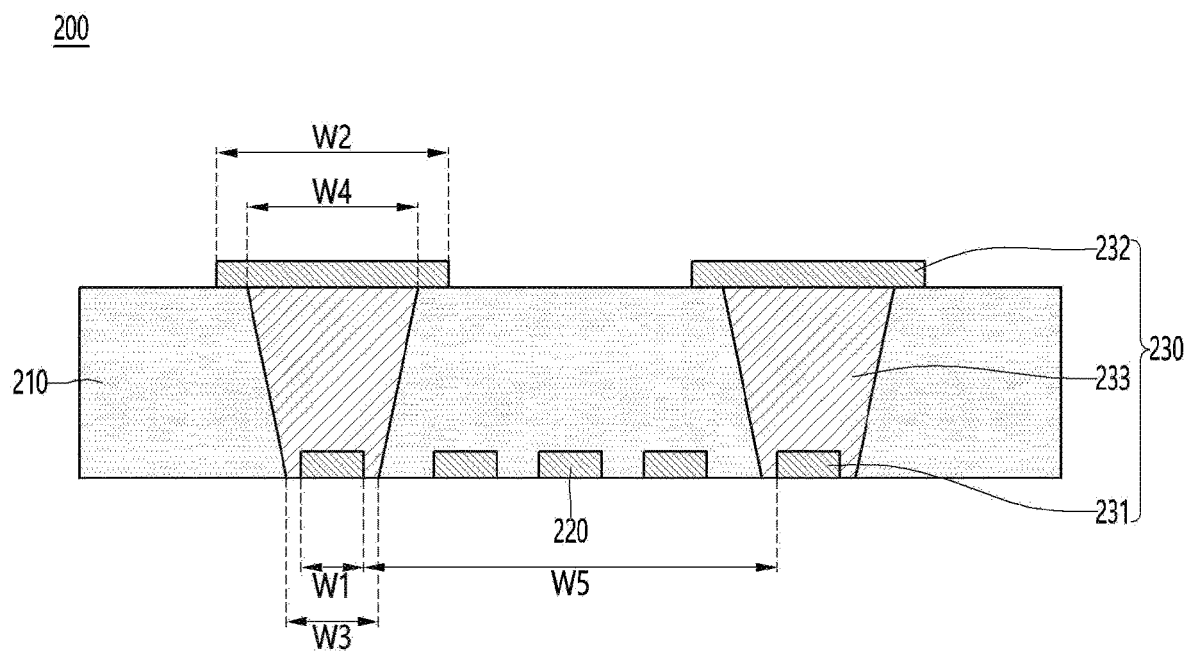

FIGS. 11 to 13 are views showing a method of manufacturing the printed circuit board according to the second embodiment shown in FIG. 10 in order of process.

Hereinafter, detailed descriptions of parts substantially identical to those in the manufacturing process of the printed circuit board according to the first embodiment will be omitted.

Referring to FIG. 11, the insulating layer 210 covering the circuit pattern 220 is formed on the copper foil layers 203 and 204 of the carrier 201.

The insulating layer 210 may include a photocurable resin or a photosensitive resin. To this end, the insulating layer 210 may include an epoxy resin, a photo initiator, a silicon-based filler (Si filler), a curing agent, and the like. For example, the insulating layer 210 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

Next, a via hole 240 is formed in the insulating layer 210. In this case, the via hole 240 may be formed by performing an exposure and development process.

At this time, the depth of the via hole 240 in the embodiment may be easily adjusted without a stopper layer such as the first pad 231 by forming the insulating layer 210 with a photocurable resin as described above, and thus forming the via hole 240 through exposure and development processes, etc.

Accordingly, the width of the lower portion of the via hole 240 is greater than the width of the upper surface of the first pad 231.

That is, the via hole 240 may be formed to surround the periphery of the first pad 231 by exposing the upper and side surfaces of the first pad 231. Accordingly, a portion of the copper foil layers 203 and 204 may be exposed through the via hole 240.

Next, referring to FIG. 12, the via part 233 may be formed by filling the inside of the via hole 240 formed in the insulating layer 210 with a metal material.

Preferably, the via part 233 may be formed by filling the via hole 240 with a metal material or plating the via hole 240 with a metal material.

The metal material for forming the via part 233 may be any one material selected from Cu, Ag, Sn, Au, Ni, and Pd, and the metal material may be filled by any one or a combination method of electroless plating, electrolytic plating, screen printing, sputtering, evaporation, ink-jetting, and dispensing.

In this case, the via part 233 may be formed to surround the side surface of the first pad 231. That is, the width of the lower surface of the via part 233 is greater than the width of the first pad 231, and thus may be formed in the insulating layer 210 while covering the side and upper surfaces of the first pad 231.

In addition, a second pad 232 in contact with the upper surface of the via part 233 is formed on the insulating layer 210.

Next, referring to FIG. 13, the plurality of printed circuit boards 200 manufactured on both sides of the carrier 201 are separated from each other by removing the carrier 201.

As described above, the first pad 231 may be disposed on the lower surface of the insulating layer 210 to have a first width W1.

In addition, the via part 233 of the via portion 230 may be disposed in the insulating layer 210. A lower surface of the via part 233 may directly contact an upper surface and a side surface of the first pad 231. Also, an upper surface of the via part 233 may directly contact a lower surface of the second pad 232.

The width of the lower surface of the via part 233 may have a third width W3 greater than the first width W1 of the first pad 231. Accordingly, the via part 233 may be disposed to surround the periphery of the first pad 231. As described above, the width of the first pad 231 in the second embodiment may be formed to be smaller than the width of the via part 233, and thus design freedom may be further improved.

Figure 14:
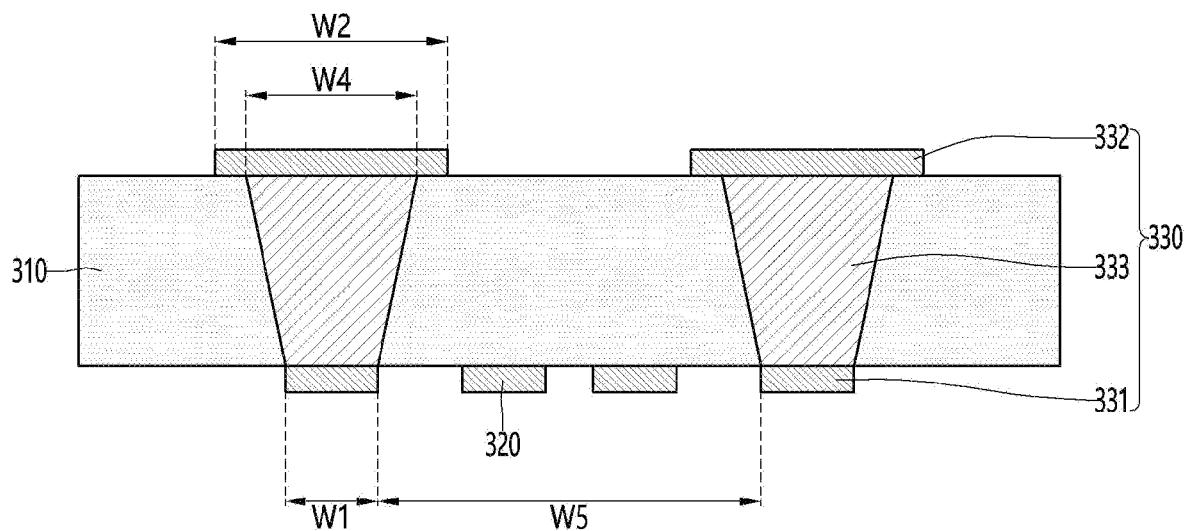
FIG. 14 is a view showing a printed circuit board according to a third embodiment.

FIG. 14 is a view showing a printed circuit board according to a third embodiment.

FIGS. 2 and 10, the circuit pattern had an ETS structure embedded in the insulating layer. On the other hand, the circuit pattern in FIG. 14 may have a structure protruding from the surface of the insulating layer.

Referring to FIG. 14, the printed circuit board 300 includes an insulating layer 310, a circuit pattern 320, and a via portion 330.

The insulating layer 310 may include a photocurable resin or a photosensitive resin. To this end, the insulating layer 310 may include an epoxy resin, a photo initiator, a silicon-based filler (Si filler), a curing agent, and the like. For example, the insulating layer 310 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

In the embodiment, a small-sized fine circuit pattern and fine via portion may be formed by exposure and development, and the like by forming the insulating layer 310 with a photocurable resin.

A circuit pattern 320 may be disposed under the lower surface of the insulating layer 310. That is, the circuit pattern 320 may have a structure protruding under the lower surface of the insulating layer 310.

Also, the printed circuit board 300 may include a via portion 330.

The via portion 330 includes a first pad 331 disposed under the lower surface of the insulating layer 310, a second pad 332 disposed on the insulating layer 310, and a via part passing through the insulating layer 310.

The first pad 331 may have a structure protruding under the lower surface of the insulating layer 310. The first pad 331 may be formed together with the circuit pattern 320, and accordingly, a part of the circuit pattern 320 may be the first pad 331.

A second pad 332 may be disposed on the upper surface of the insulating layer 310. The second pad 332 may have a structure protruding on the upper surface of the insulating layer 310.

The first pad 331 may be disposed on the lower surface of the insulating layer 310 to have a first width W1. The first pad 331 may also be referred to as a land pad. The width of the lower surface of the first pad 331 may be the same as that of the upper surface the first pad 331.

In addition, the second pad 332 may be disposed on the upper surface of the insulating layer 310 to have a second width W2. The second pad 332 may also be referred to as a capture pad. The width of the lower surface and the width of the upper surface of the second pad 332 may be the same as each other.

In addition, the via part 333 of the via portion 330 may be disposed in the insulating layer 310. A lower surface of the via part 333 may directly contact an upper surface of the first pad 331. Also, an upper surface of the via part 333 may directly contact a lower surface of the second pad 332.

The width of the lower surface of the via part 333 may be the same as the first width W1 of the first pad 331. That is, the lower surface of the via part 333 may have the first width W1.

Also, the width of the upper surface of the via part 333 may be smaller than the second width W2 of the second pad 332. That is, the upper surface of the via part 333 may have a fourth width W4 smaller than the second width W2 of the second pad 332.

In addition, the first width W1 of the lower surface of the via part 333 is smaller than the fourth width W4 of the upper surface of the via part 333. That is, the via part 333 may have a shape in which the width gradually decreases from the upper surface to the lower surface.

As described above, the width of the lower surface of the via part 333 in the embodiment is the same as the width of the first pad 331 disposed under the via part 333. Accordingly, the separation distance W5 between the plurality of via parts in the embodiment may increase compared to the comparative example illustrated in FIG. 1. That is, a separation distance between the lower surfaces of the plurality of via parts in an embodiment may be the same as a separation distance between the plurality of first pads. Accordingly, the separation distance between the plurality of via parts in the embodiment may be increased, thereby improving circuit density and design freedom.

Figure 15:
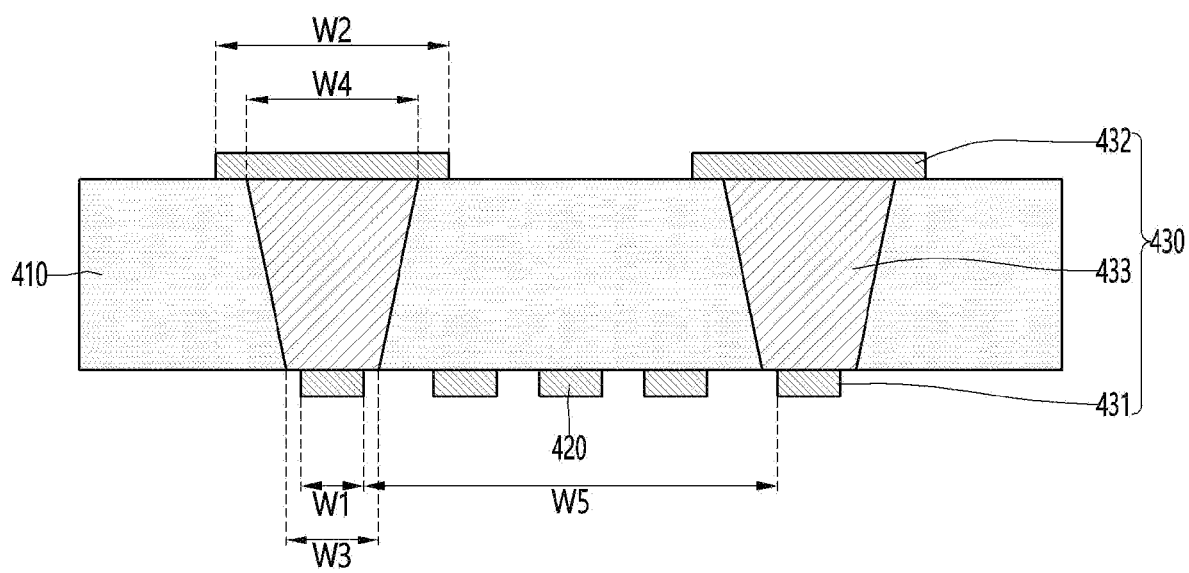
FIG. 15 is a view showing a printed circuit board according to a fourth embodiment.

FIG. 15 is a view showing a printed circuit board according to a fourth embodiment.

FIGS. 2 and 10, the circuit pattern had an ETS structure embedded in the insulating layer. In contrast, the circuit pattern in FIG. 15 may have a structure protruding from the surface of the insulating layer.

Referring to FIG. 15, the printed circuit board 400 includes an insulating layer 410, a circuit pattern 420, and a via portion 430.

The insulating layer 410 may include a photocurable resin or a photosensitive resin. To this end, the insulating layer 410 may include an epoxy resin, a photo initiator, a silicon-based filler (Si filler), a curing agent, and the like. For example, the insulating layer 410 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

The circuit pattern 420 may be disposed under the lower surface of the insulating layer 410. That is, the circuit pattern 420 may have a structure protruding under the lower surface of the insulating layer 410.

Also, the printed circuit board 400 may include a via portion 430.

The via portion 430 may include a first pad 431 disposed under the lower surface of the insulating layer 410, a second pad 432 disposed on the insulating layer 410, and a via part 433 passing through the insulating layer 410.

The first pad 431 may have a structure protruding under the lower surface of the insulating layer 410. The first pad 431 may be formed together with the circuit pattern 420, and accordingly, a portion of the circuit pattern 420 may be the first pad 431.

The second pad 432 may be disposed on the upper surface of the insulating layer 410. The second pad 432 may have a structure protruding on the upper surface of the insulating layer 410.

The first pad 431 may be disposed on the lower surface of the insulating layer 410 to have a first width W1. The first pad 431 may also be referred to as a land pad. The width of the lower surface of the first pad 431 may be the same as that of the upper surface of the first pad 431.

In addition, the second pad 432 may be disposed on the upper surface of the insulating layer 410 to have a second width W2. The second pad 432 may also be referred to as a capture pad. The width of the lower surface of the second pad 432 may be the same as that of the upper surface.

Also, the via part 433 of the via portion 430 may be disposed in the insulating layer 410. A lower surface of the via part 433 may directly contact an upper surface of the first pad 431. Also, an upper surface of the via part 433 may directly contact a lower surface of the second pad 432.

A width of a lower surface of the via part 433 may be greater than a first width W1 of the first pad 431. That is, the lower surface of the via part 433 may have a third width W3 greater than the first width W1.

Accordingly, the lower surface of the via part 433 may include a first region in contact with the upper surface of the first pad 431 and a second region in contact with the first pad 431. In this case, the second region may be covered by an additional insulating layer disposed under the insulating layer 410, or alternatively, it may be covered by a Solder Resist (SR).

Also, the width of the upper surface of the via part 433 may be smaller than the second width W2 of the second pad 432. That is, the upper surface of the via part 433 may have a fourth width W4 smaller than the second width W2 of the second pad 432.

In addition, the third width W3 of the lower surface of the via part 433 is smaller than the fourth width W4 of the upper surface of the via part 433. That is, the via part 433 may have a shape in which the width gradually decreases from the upper surface to the lower surface.

As described above, the width of the lower surface of the via part 433 in the embodiment is greater than the width of the first pad 431 disposed under the via part 433. Accordingly, the separation distance W5' between the plurality of via parts in the embodiment may be increased compared to the first to third embodiments as well as the comparative example illustrated in FIG. 1.

Figure 16:
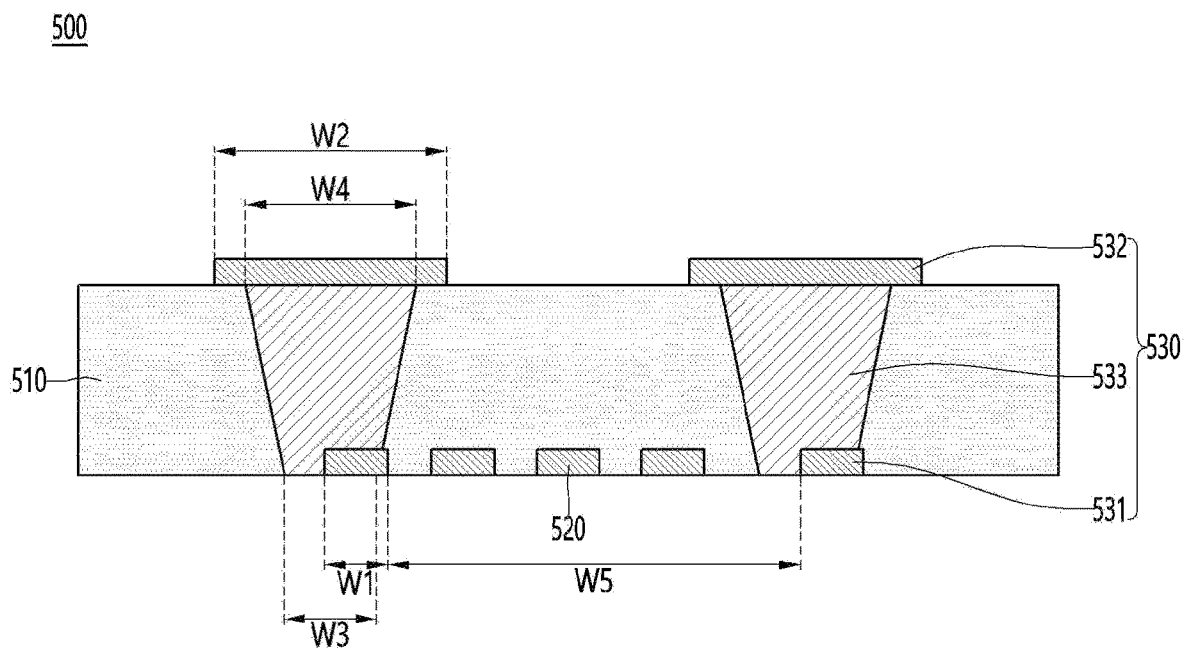
FIG. 16 is a view showing a printed circuit board according to a fifth embodiment.

FIG. 16 is a view showing a printed circuit board according to a fifth embodiment.

Referring to FIG. 16, the printed circuit board 500 includes an insulating layer 510, a circuit pattern 520, and a via portion 530.

In this case, a center of the via part and a center of the first pad in the via portions of the first to fourth embodiments are aligned on the same vertical line. In other words, the via part and the first pad are aligned and disposed on a vertical line.

Alternatively, the via part and the first pad of the via portion 530 according to the fifth embodiment may be displaced from each other without being aligned on the same vertical line.

The insulating layer 510 may include a photocurable resin or a photosensitive resin. To this end, the insulating layer 510 may include an epoxy resin, a photo initiator, a silicon-based filler (Si filler), a curing agent, and the like. For example, the insulating layer 510 may be formed by laminating a photocurable resin film or applying a photocurable resin paste or liquid. At this time, the photocurable resin material in one example may include any one or more selected from a photocurable polyhydroxystyrene (PHS), a photocurable polybenzoxazole (PBO), a photocurable polyimide (PI), a photocurable benzocyclobutene (BCB), a photocurable polysiloxane, a photocurable epoxy, and a novolac resin.

A circuit pattern 520 may be disposed under the insulating layer 510. That is, the circuit pattern 520 may have a structure buried in a lower region of the insulating layer 510.

Also, the printed circuit board 500 may include a via portion 530.

The via portion 530 may include a first pad 531 disposed under the lower surface of the insulating layer 510, a second pad 532 disposed on the insulating layer 510, and a via part 533 passing through the insulating layer 510.

The first pad 531 may be disposed in a lower region of the insulating layer 510 to have a first width W1. The first pad 531 may also be referred to as a land pad. The width of the lower surface of the first pad 531 may be the same as that of the upper surface of the first pad 531.

In addition, the second pad 532 may be disposed on the upper surface of the insulating layer 510 to have a second width W2. The second pad 532 may also be referred to as a capture pad. The width of the lower surface and the width of the upper surface of the second pad 532 may be the same as each other.

In addition, the via part 533 of the via portion 530 may be disposed in the insulating layer 510. A lower surface of the via part 533 may directly contact an upper surface of the first pad 531. Also, an upper surface of the via part 533 may directly contact a lower surface of the second pad 532.

The width of the lower surface of the via part 533 may be the same as the first width W1 of the first pad 531, and alternatively, it may have a third width W3 greater than the first width W1.

However, a vertical center of the via part 533 in the fifth exemplary embodiment may not be aligned with a vertical center of the first pad 531 on the same vertical line and may be shifted.

Accordingly, the lower surface of the via part 533 may include a first region in contact with the upper surface of the first pad 531 and a second region in contact with the first pad 531. In this case, the second region may be covered by an additional insulating layer disposed under the insulating layer 510, or alternatively, it may be covered by a Solder Resist (SR).

Also, the width of the upper surface of the via part 533 may be smaller than the second width W2 of the second pad 532. That is, the upper surface of the via part 533 may have a fourth width W4 smaller than the second width W2 of the second pad 532.

As described above, the width of the lower surface of the via part 533 in the embodiment may be equal to or greater than the width of the first pad 531 disposed under the via part 533. However, the center of the via part 533 may not be aligned with the center of the first pad 531 in a vertical line and may be shifted. In this case, the reliability of the via part in the comparative example was determined by the alignment between the via part and the first pad. This is because the via part in the comparative example is formed in the via hole formed by the laser. In contrast, a via hole of the embodiment is formed in the photocurable resin through exposure and development processes, etc., and a metal material is filled in the formed via hole to form a via part. Accordingly, even if the center of the via hole and the center of the first pad are not aligned on the same vertical line and deviate from each other, reliability of the via part in the embodiment is not affected. This is, the insulating layer is formed of a photocurable resin, and accordingly, it is possible to easily control the via hole to be formed only in a desired region of the insulating layer through the exposure and development process.

The invention claimed is:

1. A circuit board comprising:
an insulating layer including an upper surface and a lower surface opposite to the upper surface;
a via part passing through the upper and lower surfaces of the insulating layer and having an inclination in which a width decreases in a horizontal direction from the upper surface to the lower surface of the insulating layer; and
a first pad disposed on the lower surface of the insulating layer;
wherein a width of the first pad is smaller than a width of a lower surface of the via part, and
wherein an upper surface of the first pad includes:
a first portion in contact with the through via part; and
a second portion connected to the first portion and in contact with the insulating layer.

2. The circuit board of claim 1, further comprising a circuit pattern disposed on the lower surface of the insulating layer to be spaced apart from the first pad in the horizontal direction and not overlapped with the via part in a thickness direction.

3. The circuit board of claim 2, wherein a width of the circuit pattern is the same as the width of the first pad.

4. The circuit board of claim 3, wherein a lower surface of the via part, a lower surface of the first pad, and a lower surface of the circuit pattern are positioned on a same plane.

5. The circuit board of claim 2,
wherein the via part includes a plurality of via parts spaced apart from each other in the insulating layer in the horizontal direction, and
wherein a plurality of the circuit patterns are disposed between two via parts disposed adjacent to each other.

6. The circuit board of claim 1, further comprising:
a second pad disposed on the upper surface of the insulating layer and the via part.

7. The circuit board of claim 6, wherein a width of the second pad is greater than a width of the upper surface of the via part.

8. The circuit board of claim 1, wherein a central portion of the first pad and a central portion of the via part in a thickness direction are disposed to be shifted from each other on a same vertical line.

9. The circuit board of claim 1, wherein a width of an upper surface of the first pad in contact with the via part is greater than a width of an upper surface of the first pad in contact with the insulating layer.

10. The circuit board of claim 1, wherein the insulating layer is formed of a photo-curable resin (PID: Photoimageable dielectrics).

11. The circuit board of claim 1, wherein an end of the second portion of the first pad intersects the inclination of the via part in a thickness direction.

* * * * *